United States Patent
Stevens

(10) Patent No.: US 6,359,784 B1
(45) Date of Patent: Mar. 19, 2002

(54) PACKAGE FOR AN ELECTRICAL APPARATUS AND METHOD OF MANUFACTURING THEREFORE

(76) Inventor: David Leonard Stevens, 722 Sumner Dr., Mesquite, TX (US) 75149

(*) Notice: Subject to any disclaimer, the term of this patent is extended or adjusted under 35 U.S.C. 154(b) by 0 days.

(21) Appl. No.: 09/613,404

(22) Filed: Jul. 11, 2000

(51) Int. Cl.$^7$ .................................. H05K 7/20
(52) U.S. Cl. ................ 361/704; 361/715; 361/720
(58) Field of Search .................. 174/252; 361/704, 361/707, 709–710, 712–713, 715, 720–721, 802–804, 807–810, 742–743, 745, 758

(56) References Cited

U.S. PATENT DOCUMENTS

| | | | | |
|---|---|---|---|---|
| 5,497,291 A | * | 3/1996 | Hosen ........................ | 361/804 |
| 5,639,990 A | * | 6/1997 | Nishihara et al. ........... | 361/760 |
| 5,835,350 A | | 11/1998 | Stevens ...................... | 361/704 |

* cited by examiner

Primary Examiner—Gregory Thompson
(74) Attorney, Agent, or Firm—Law Office of Donald D. Mondul

(57) ABSTRACT

A package for an electrical apparatus is disclosed. The electrical apparatus includes a plurality of electrical components; the package comprises: (a) a first circuit board having a top side and a bottom side, and having a first array of the plurality of components arranged on at least one side of the top side and the bottom side; (b) a second circuit board in electrical and mechanical connection with the first circuit board; the second circuit board has a first side and a second side. The first side faces the top side of the first circuit board. The second circuit board has a second array of the plurality of components arranged on the first side. The second circuit board preferably has at least one heat dissipating structure substantially integrally affixed on the second side. Preferably, the second side is a metal substrate and the first side is electrically insulated from the second side. The package may further include one circuit board presenting an integral connection structure extending a standoff distance measured substantially perpendicular to the plane of the circuit board. The connection structure is affixed with the other circuit board when the package is in an assembled orientation. The method for manufacturing the apparatus comprises the steps of: (a) providing an insulated metal substrate presenting a first component bearing side and a second metallic side electrically insulated from each other; (b) providing a heat dissipating structure; and (c) substantially integrally affixing the heat dissipating structure with the substrate at the second side.

10 Claims, 3 Drawing Sheets

PACKAGE FOR AN ELECTRICAL APPARATUS AND METHOD OF MANUFACTURING THEREFORE

BACKGROUND OF THE INVENTION

The present invention is directed to packages for electrical apparatuses. In particular, the present invention is directed to packages for electrical apparatuses employing insulated metal substrate elements in their construction. The present invention includes packages for electrical apparatuses needing a heat dissipation structure, such as a heat sink, included in the package.

The apparatus of the present invention presents an open-frame board mountable electrical apparatus, such as a power supply, which is surface mountable. The construction of the apparatus eliminates the need for potting the assembled apparatus while maintaining good thermal dissipation characteristics.

Prior art packaging of electrical apparatuses requiring incorporation of heat dissipating structures employ extruded heat sink components, thermal conductive pads, potting techniques and other features that contribute to inefficient heat transfer away from components sought to be cooled.

It would be beneficial to have an electrical apparatus packaged compactly that has good heat dissipative characteristics. It would be especially advantageous to provide such a product that is surface mountable. It would also be advantageous if such an electrical apparatus could be packaged to efficiently include a heat dissipating structure, such as a heat sink.

SUMMARY OF THE INVENTION

A package for an electrical apparatus is disclosed. The electrical apparatus includes a plurality of electrical components; the package comprises: (a) a first circuit board having a top side and a bottom side, and having a first array of the plurality of components arranged on at least one side of the top side and the bottom side; (b) a second circuit board in electrical and mechanical connection with the first circuit board; the second circuit board has a first side and a second side. The first side faces the top side of the first circuit board. The second circuit board has a second array of the plurality of components arranged on the first side. The second circuit board preferably has at least one heat dissipating structure substantially integrally affixed on the second side. Preferably, the second side is a metal substrate and the first side is electrically insulated from the second side. The package may further include one circuit board presenting an integral connection structure extending a standoff distance measured substantially perpendicular to the plane of the circuit board. The connection structure is affixed with the other circuit board when the package is in an assembled orientation.

The method for manufacturing the apparatus comprises the steps of: (a) providing an insulated metal substrate presenting a first component bearing side and a second metallic side electrically insulated from each other; (b) providing a heat dissipating structure; and (c) substantially integrally affixing the heat dissipating structure with the substrate at the second side.

Further features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE DRAWINGS

Figure 1:
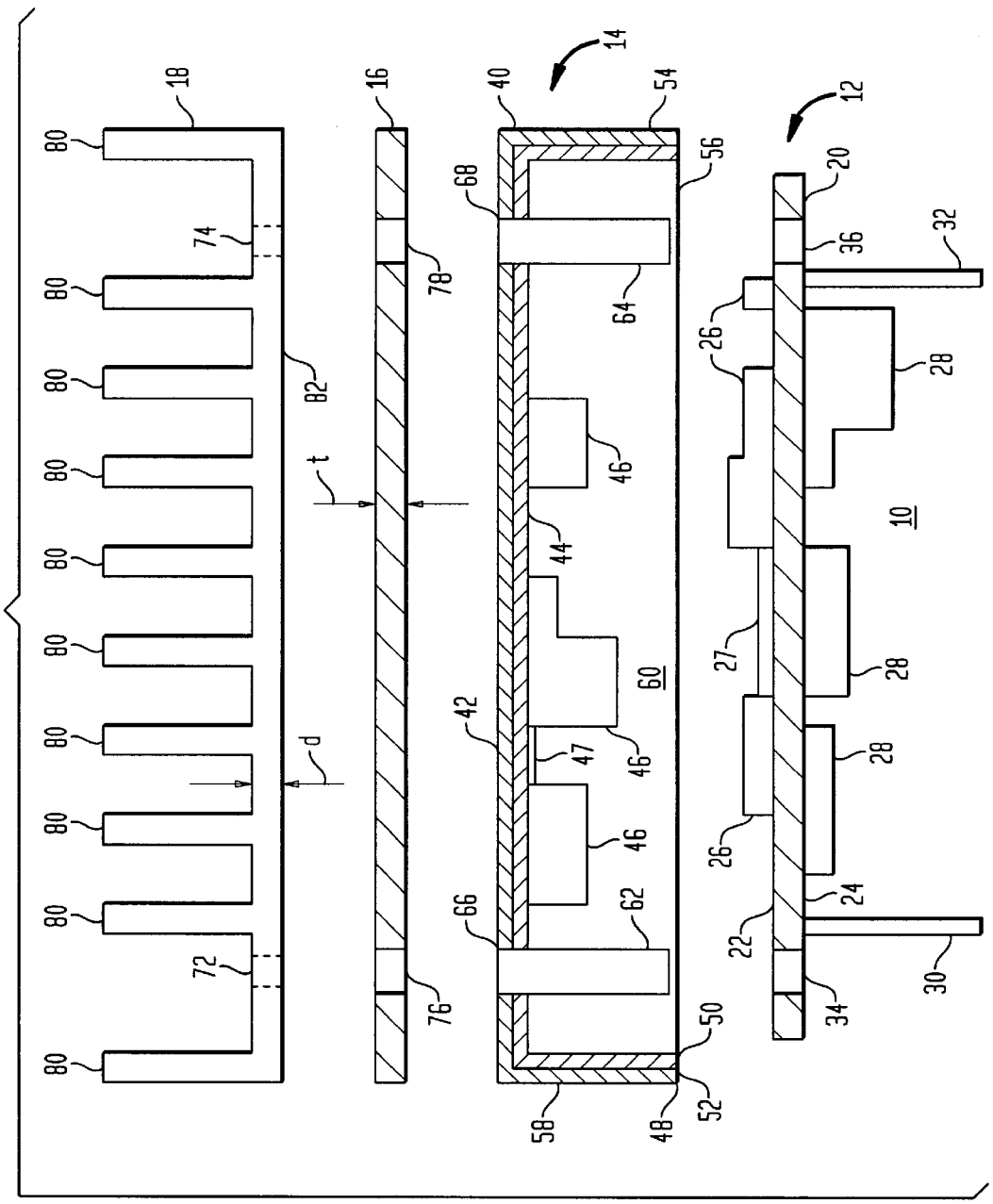
FIG. 1 illustrates a prior art electrical package in an exploded partial section view.

FIG. 1 illustrates a prior art electrical package in an exploded partial section view. In FIG. 1, an electrical package 10 includes a first circuit assembly 12, a second circuit assembly 14, a thermally conductive pad 16 and a heat sink 18. The package illustrated in FIG. 1 is described is detail in U.S. Pat. No. 5, 835, 350 for "Encapsulated, Board-Mountable Power Supply and Method of Manufacture Therefore", by the present inventor, David L. Stevens, and assigned to the assignee of the present application.

Thermally conductive pad 16 has a thickness "t". Heat sink 18 has a plurality of heat dissipating members 80 depending from a base 82. Base 82 has a thickness "d". Heat sink 18 is commonly an extruded piece often made of aluminum, but sometimes made of steel or copper.

First circuit assembly 12 includes a printed wiring board, or circuit board 20 having a top side 22 with circuit components 26 arrayed thereon, and a bottom side 24 with circuit components 28 arrayed thereon. Circuit components 26 are selectively interconnected by circuit traces 27 or other conductive paths on top side 22, and circuit components 28 may be similarly selectively interconnected by circuit traces or other conductive paths on bottom side 24 (not shown in detail in FIG. 1). Selected components 26, 28 may be interconnected between top side 22 and bottom side 24 using connection techniques such as through-hole connections, interlayer via structures, or other connecting structures. Pins 30, 32 (there may be more than two pins) may be selectively connected with any or several components 26, 28. Pins 30, 32 establish connection between package 10 and a host apparatus (not shown in FIG. 1) with bottom side 24 in facing relation with a host apparatus when package 10 is installed with the host apparatus.

Second circuit assembly 14 includes a circuit board 40 having a top side 42 and a bottom side 44. Circuit board 40 has circuit components 46 arrayed on bottom side 44. Circuit components 46 are interconnected by circuit traces 47 or other conductive paths on bottom side 44. Circuit board 40 is configured as an insulated metal substrate having a metal layer 48, an etched metal layer 50 and an insulating layer 52 intermediate metal layer 48 and etched metal layer 50. Generally, metal layer 48 of second circuit board 40 is aluminum. Etched metal layer 50 is etched from a full metal layer substantially coextensive with metal layer 48 during manufacture of circuit board 40. Generally, etched metal layer 50 is copper. The etching to which etched 50 is subjected substantially establishes circuit traces 47 and other electrically conductive paths on bottom side 44 for selectively connecting or otherwise accommodating circuit components 46, for facilitating inter-board connections between circuit assemblies 12, 14, and for other electrical connection structures. Circuit board 40 is foldingly manipulated to create a plurality of walls 54, 56, 58 (plus another wall not visible in FIG. 1) to define a well 60 into which circuit assembly 12 is received during assembly of package 10. Well 60 is often filled with a nonconductive material to effect encapsulating of electrical components 26, 28, 46 after assembly of package 10 is completed.

Mounting studs 62, 64 are affixed with respect to circuit assembly 14, such as by being press-fit within apertures 66, 68—other affixing structures may also be used. As first circuit assembly 12 is inserted within well 60, mounting stud 62 is received within an aperture 34, and mounting stud 64 is received within an aperture 36.

Providing a threaded interior within mounting studs 62, 64 affords an opportunity for employing threaded fasteners for locating and affixing package 10 within a host apparatus (if desired; threaded interiors not shown in FIG. 1). Such a threaded interior within mounting studs 62, 64 also affords an opportunity for threadedly affixing heat sink 18 with second circuit assembly 14 by passing threaded fasteners through apertures 72, 74 for threaded engagement with mounting studs 62, 64. Adhesive or other attachment systems may be employed for fastening heat sink 18 with second circuit assembly 14, if desired. When threaded fasteners are employed for attachment, thermally conductive pad 16 is captively secured intermediate heat sink 18 and second circuit assembly 14 with apertures 76, 78 in thermally conductive pad 16 accommodating passage of the threaded fasteners through thermally conductive pad 16.

Figure 2:
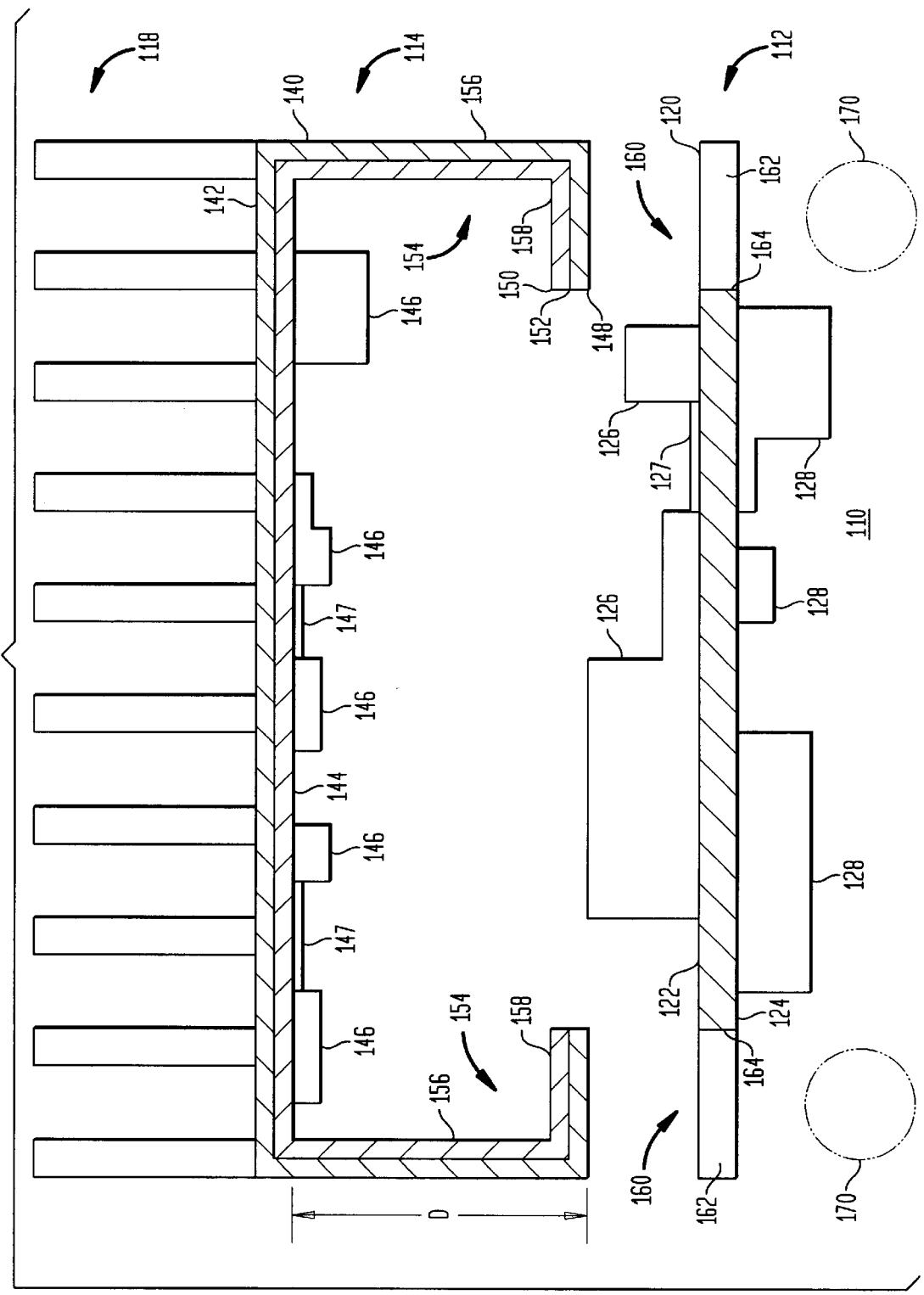
FIG. 2 illustrates an electrical package fashioned according to the present invention in exploded partial section view.

FIG. 2 illustrates an electrical package fashioned according to the present invention in exploded partial section view. In FIG. 2, an electrical package 110 includes a first circuit assembly 112, and a second circuit assembly 114. Electrical package 110 may also include a heat dissipating structure 118.

First circuit assembly 112 includes a printed wiring board, or circuit board 120 having a top side 122 with circuit components 126 arrayed thereon, and a bottom side 124 with circuit components 128 arrayed thereon. Circuit components 126 are selectively interconnected by circuit traces 127 or other conductive paths on top side 122, and circuit components 128 may be selectively interconnected by circuit traces or other conductive paths on bottom side 124 (not shown in detail in FIG. 2). Selected components 126, 128 may be interconnected between top side 122 and bottom side 124 using connection techniques such as through-hole connections, interlayer via structures, or other connecting structures.

Second circuit assembly 114 includes a circuit board 140 having a top side 142 and a bottom side 144. Circuit board 140 has circuit components 146 arrayed on bottom side 144. Circuit components 146 are interconnected by circuit traces 147 or other conductive paths on bottom side 144. Circuit board 140 is configured as an insulated metal substrate having a metal layer 148, an etched metal layer 150 and an insulating layer 152 intermediate metal layer 148 and etched metal layer 150. Preferably, metal layer 148 of second circuit board 114 is copper. Etched metal layer 150 is etched from a full metal layer substantially coextensive with metal layer 148 during manufacture of circuit board 140. Generally, etched metal layer 150 is copper. The etching to which etched layer 150 is subjected substantially establishes circuit traces 147 and other electrically conductive paths on bottom side 144 for selectively connecting or otherwise accommodating circuit components 146, for facilitating inter-board connections between circuit assemblies 112, 114, and for other electrical connection structures in package 110.

Portions of circuit board 140 are foldingly manipulated to create a plurality of standoff structures 154. In the representative embodiment of the present invention illustrated in FIG. 2, there is a respective standoff structure 154 established at each corner of circuit board 140. Particular placement of respective standoff structures 154 is dependent upon particular design circumstances of each respective package, and placement at corners is not a requirement of the invention.

A useful structure for standoff structures 154 is an L-shaped structure with a standoff leg portion 156 depending substantially perpendicularly from bottom side 144 of circuit board 140 toward first circuit assembly 112. At a standoff distance "D" from bottom side 144 of circuit board 140, a departure at substantially a right angle from standoff leg portion 156 establishes a standoff base portion 158. Preferably, the departure from standoff leg portion 156 is appropriate to establish standoff base portion 158 generally in register with package 110 in an assembled orientation. Such an orientation results in package 110 occupying a smaller "footprint" on a host substrate upon which it may be installed. However, a departure from standoff leg portion 156 establishing standoff base portion 158 in another orientation is within the teachings of the present invention. For example, standoff structures 154 may terminate at the end of standoff leg portion 156 without presenting an L-shaped structure by a standoff base portion 158.

Whatever the particular structure of standoff structures 154, one advantage of such unitary structures is that they provide a structural facility for soldering second circuit assembly 114 to a host apparatus (not shown in FIG. 2) to effect grounding of second circuit assembly 114, if desired. Such soldering of second circuit assembly 114 with a host apparatus (or host substrate or host element) avoids the need for screws or other additional parts to establish electrical grounding, and enhances the unitary structural arrangement that is established between a surface mounted package, such as electrical package 110, and a host apparatus. Such an enhanced unitary structural arrangement improves resistance to environmental, thermal and other stresses commonly experienced by such packaging connections.

Package 110 is assembled by urging first circuit assembly 112 into a connective generally adjacent relation with second circuit assembly 114. The precise assembled arrangement of first circuit assembly 112 with second circuit assembly 114 is defined by connective structures, such as pin and socket structures, pin and through-hole structures, or other structures or combinations of structures. Such connective structures may vary among particular products employing package 110.

First circuit assembly 112 accommodates assembly of package 110 as first circuit assembly 112 is urged into close relation with second circuit assembly 114 with void expanses 160 facilitating passing of standoff base portions 154 during the assembly operation. In the representative embodiment of the present invention illustrated in FIG. 2, void expanses 160 are manifested as corner cut-outs presenting walls 162, 164 leaving an open space at each corner through which standoff base portions 158 pass during assembly of package 110. In an assembled orientation, with first circuit assembly 112 in generally adjacent position with second circuit assembly 114, standoff structures 154 extend sufficiently past bottom side 124 of circuit board 120 to accommodate surface mounting of package 110 upon a host substrate (not shown in FIG. 2) using solderable metal balls 170, such as solder plated copper balls (shown in phantom in FIG. 2).

When incorporated into package 110, heat dissipating structure 118 is preferably integrally united with metal layer 148 of circuit board 140, as by soldering, adhesive attachment or another attachment mechanism. Such direct integral incorporation of heat dissipating structure 118 with package 110 significantly enhances thermal conduction of heat away from circuit components 126, 128, 146. Heat dissipating structure 118 is illustrated in FIG. 2 in one particular embodiment. Heat dissipating structure 118 may be embodied in any structure amenable to integral connection with metal layer 148, such as a one-piece folded fin structure, a plurality of tubular heat dissipation structures, a plurality of individual heat dissipating fin structures and other heat dissipation structures known to those skilled in the art of heat sinks and heat dissipation in electrical packages.

Referring to FIG. 1, one may observe that heat dissipating through or from circuit board 40 must traverse thermally conductive pad 16 (having a thickness "d") and base 82 of heat sink 18 (having a thickness "D"). These interfaces impede the heat transfer to heat dissipation members 80 of heat sink 18. Integrally incorporating heat dissipating structure 118 with metal layer 148—with no intervening pad or base structure that must be traversed before significant heat dissipation can occur—is a significant advantage provided by the apparatus of the present invention. A result is that heat from package 110 can reach heat dissipating structure 118 with reduced thermal impedance. This results in a more thermally efficient package.

Another advantage provided by the assembled orientation of package 110 is the open-frame structure it establishes. That is, there is no well within which potting material is deposited. A beneficial consequence of the open-frame structure is that air may flow through package 110, thereby further enhancing heat dissipation from circuit components 127, 128, 146.

The facility of package 110 for surface mounting upon a host substrate is a further advantage provided by the present invention. Elimination of a thermally conductive pad 16 (FIG. 1) and a base section 82 (FIG. 1) for a heat sink also facilitates construction of lower profile packages than can be constructed using prior art technology.

Packages amenable to surface mounting, having a low profile and efficiently dissipating heat have important advantages in today's marketplace that demands ever smaller packages having ever higher power requirements.

Figure 3:
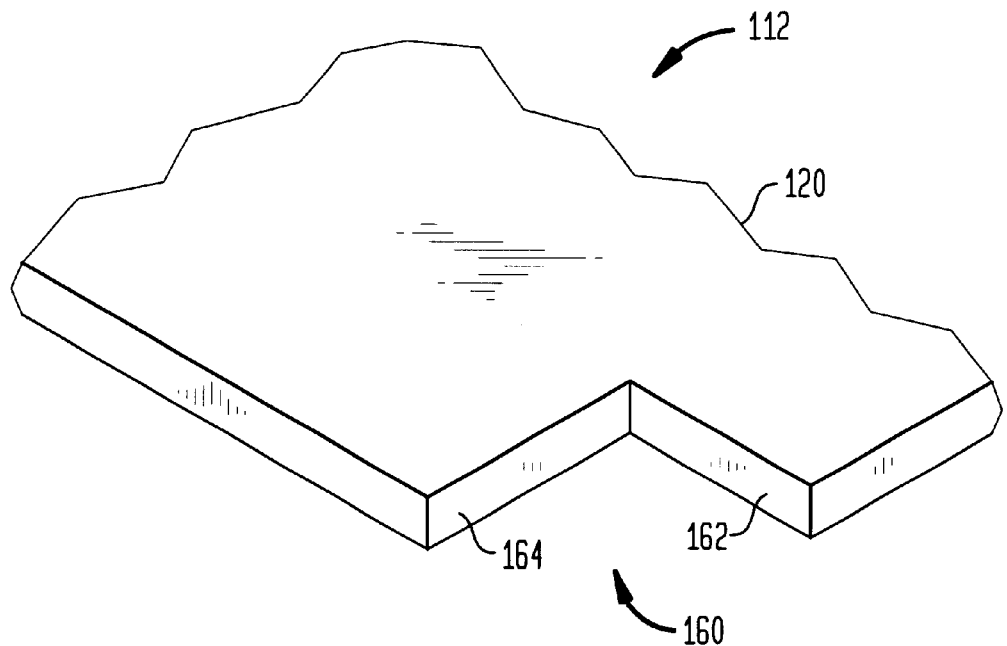
FIG. 3 is a perspective view of a detail of FIG. 2.

FIG. 3 is a perspective view of a detail of FIG. 2. In FIG. 3, a corner portion of first circuit assembly 112 (FIG. 2) is illustrated showing removal of a corner of circuit board 120 to establish a void expanse 160 defined by walls 162, 164. Void expanse 160 is established having sufficient expanse to accommodate passing standoff base portion 158 during assembly of package 110.

Preferably, metal layer 148 is copper. Copper has a higher thermal conductivity than aluminum, used in prior art packages. For the same spreading rate (thermal dissipation), a thinner copper layer may be employed, thereby contributing further to lower profile. Copper can also be plated to present a solderable surface to accommodate soldering heat dissipating structures 118 to metal layer 148. Elimination of a base member for a heat sink still further contributes to a lower profile while enhancing heat dissipation.

Foregoing creation of walls to establish a well, and foregoing potting reduces material requirements (substrate material and potting material) and facilitates air flow thorough package 110 to further aid heat dissipation.

Using solderable metal balls, such as solder plated copper balls, for surface mounting package 110 to a host substrate helps alignment of connections between package 110 and the host substrate. Solderable metal balls move freely during a reflow solder operation, thus allowing for larger tolerance in handling package 110 during assembly operations with a host substrate. Orientation of a package constructed for surface mounting according to the teachings of the present invention is also facilitated in a manufacturing environment because gravity contributes to proper positioning and proper pressure of a package upon a host substrate during assembly with the host substrate.

Using a thermal interface material (thermally conductive, but electrically insulative) to fill voids within package 110, the rate of heat dissipation in package 110 can be managed. Selective heat dissipation management is possible within package 110 by selectively applying thermal interface material to particular components 126, 128, 146 or within selected voids within package 110 and not to other components or voids.

Elimination of mounting studs (e.g., mounting studs 62, 64; FIG. 1) provides a significant cost saving. Mounting studs have high piece-part cost, occupy significant assembly time, and occupy space in the electrical package. All of those disadvantageous aspects are avoided by eliminating mounting studs. Further piece-part reduction and associated assembly time savings are realized by attaching heat dissipative structures to metal layer 148 using solder or adhesive because threaded fasteners used for such attachment in prior art structures are eliminated More efficient heat dissipation because of the elimination of thermally conductive pad 16 and base 82 of heat sink 18 means a designer has a choice of (1) using a heat sink of similar size as a prior art heat sink in a given package to achieve improved heat dissipation, or (2) achieving the same amount of heat dissipation as was achieved in the prior art package while using a smaller, lower profile heat dissipation structure.

Figure 4:
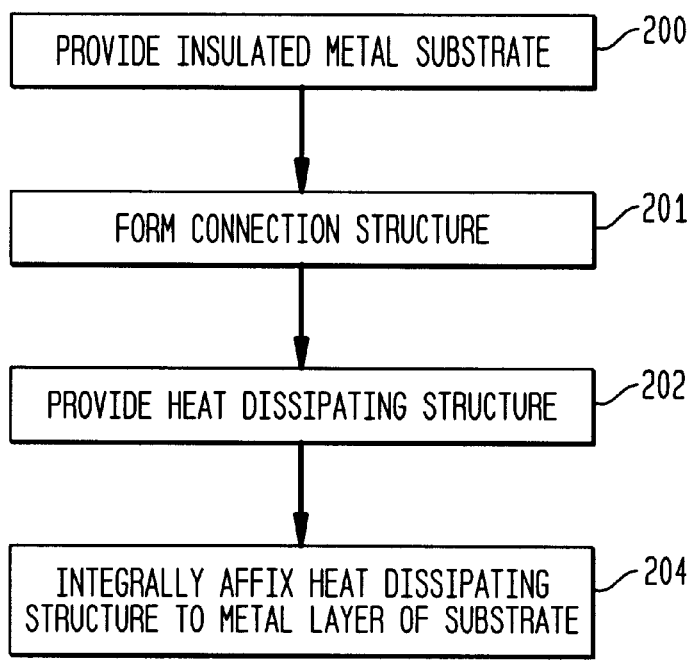
FIG. 4 is a block diagram illustrating the method of the present invention.

FIG. 4 is a block diagram illustrating the method of the present invention. In FIG. 4, the method begins by providing an insulated metal substrate, as indicated by a block 200. The substrate preferably lies generally in a plane and presents a first component bearing side and a second metallic side. The first side and the second side are electrically insulated from each other. The method continues by integrally forming at least one connection structure in the substrate. The connection structure extends a standoff distance from the substrate measured substantially perpendicular to the plane of the substrate, as indicated by a block 201.

The method may continue by providing a heat dissipating structure, as indicated by a block 202. Preferably the heat dissipating structure may comprise individual heat dissipating members, such as fins or tubes or other heat radiating structures. The method continues by integrally affixing the heat dissipating structure with the metallic second side of the insulated metal substrate, as indicated by a block 204. Affixing may be effected by soldering, by adhesive or by another affixation method.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. A package for an electrical apparatus; said electrical apparatus being configured for connection with a host element in an assembled orientation and including a plurality of electrical components; the package comprising:

(a) a first circuit board; said first circuit board being substantially symmetrical about a first plane and having a top side and a bottom side; said first circuit board having a first array of said plurality of components arranged on at least one side of said top side and said bottom side; and (b) a second circuit board; said second circuit board being substantially symmetrical about a second plane and being in electrical and mechanical connection with said first circuit board; said second circuit board having a first side and a second side; said first side facing said top side of said first circuit board; said second circuit board having a second array of said plurality of components arranged on said first side;

one circuit board of said first circuit board and said second circuit board presenting an integral connection structure; said connection structure extending a standoff distance measured substantially perpendicular to one plane of said first plane and said second plane; said connection structure including at least one standoff structure configured for effecting affixing with said host element when the package is in said assembled orientation; said second circuit board having at least one heat dissipating structure substantially integrally attached on said second side.

2. A package for an electrical apparatus as recited in claim 1 wherein said second side is a metal substrate and wherein said first side is electrically insulated from said second side.

3. A package for an electrical apparatus as recited in claim 1 wherein said affixing by said at least one standoff structure establishes an electrically conductive substantially mechanically rigid interface.

4. A package for an electrical apparatus as recited in claim 3 wherein said affixing is effected using solder.

5. A package for an electrical apparatus as recited in claim 3 wherein said affixing is effected using solderable metal balls.

6. A package for an electrical apparatus as recited in claim 3 wherein said affixing is effected using electrically conductive adhesive.

7. An electrical assembly for marshaling a plurality of components to fashion a product for connection with a host element in an assembled orientation; the assembly comprising:

(a) a first substrate; said first substrate lying generally in a first plane and configured for marshaling a first collection of components of said plurality of components in a first array;

(b) a second substrate; said second substrate lying generally in a second plane; said second substrate being an insulated metal substrate presenting a component bearing first side toward said first substrate and presenting a metallic second side away from said first substrate; said first side and said second side being electrically insulated from each other;

(c) one substrate of said first substrate and said second substrate presenting an integral connection structure; said connection structure extending a standoff distance measured substantially perpendicular to one plane of said first plane and said second plane; said connection structure including at least one standoff structure configured for effecting affixing with said host element when the assembly is in said assembled orientation; and (d) a heat dissipating structure substantially integrally affixed with said second substrate at said second side.

8. An electrical assembly for marshaling a plurality of components to fashion a product for connection with a host element in an assembled orientation as recited in claim 7 wherein said affixing by said at least one standoff structure establishes an electrically conductive substantially mechanically rigid interface.

9. An apparatus for use in marshaling a plurality of components to fashion a product for connection with a host element in an assembled orientation; the apparatus comprising:

(a) a substrate; said substrate lying generally in a plane; said substrate being an insulated metal substrate presenting a first component bearing side and a second metallic side; said first side and said second side being electrically insulated from each other;

(b) an integral connection structure in said substrate extending a standoff distance measured substantially perpendicular to said plane; said connection structure being affixed with said host element when the apparatus is in said assembled orientation; and (c) a heat dissipating structure substantially affixed with said substrate at said second side.

10. A method for manufacturing an apparatus for use in marshaling a plurality of components to fashion a product; the method comprising the steps of:

(a) providing a substrate; said substrate lying generally in a plane; said substrate being an insulated metal substrate presenting a first component bearing side and a second metallic side; said first side and said second side being electrically insulated from each other;

(b) integrally forming at least one connection structure in said substrate; said connection structure extending a standoff distance measured substantially perpendicular to said plane; and (c) providing a heat dissipating structure; said heat dissipating structure being substantially integrally affixed with said substrate at said second side.

* * * * *